United States Patent
Ko et al.

(10) Patent No.: US 12,439,506 B2
(45) Date of Patent: Oct. 7, 2025

(54) CIRCUIT BOARD

(71) Applicant: SK hynix Inc., Gyeonggi-do (KR)

(72) Inventors: Jae Hoon Ko, Gyeonggi-do (KR); Jeffrey E. Kwak, Gyeonggi-do (KR); In Myung Song, Gyeonggi-do (KR); Chong Geun Ahn, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 384 days.

(21) Appl. No.: 18/073,956

(22) Filed: Dec. 2, 2022

(65) Prior Publication Data
US 2023/0389171 A1    Nov. 30, 2023

(30) Foreign Application Priority Data

May 26, 2022    (KR) .................. 10-2022-0065015

(51) Int. Cl.
  *H05K 1/02*  (2006.01)
  *H05K 1/03*  (2006.01)
  *H05K 1/11*  (2006.01)
(52) U.S. Cl.
  CPC ......... *H05K 1/0219* (2013.01); *H05K 1/0237* (2013.01); *H05K 1/0313* (2013.01)
(58) Field of Classification Search
  CPC .. H05K 1/0216; H05K 1/0218; H05K 1/0224; H05K 1/0228; H05K 1/0237; H05K 1/025
  See application file for complete search history.

(56) References Cited

U.S. PATENT DOCUMENTS

| | | | |
|---|---|---|---|
| 10,617,009 B1 | 4/2020 | Noonan et al. | |
| 11,765,822 B1* | 9/2023 | Huang | H05K 3/4644 174/261 |
| 2002/0181185 A1* | 12/2002 | Kabumoto | H01L 23/49822 257/E23.079 |
| 2007/0069325 A1* | 3/2007 | Yamanaka | H05K 1/0216 257/499 |
| 2008/0230258 A1* | 9/2008 | Shen | G06F 1/16 174/251 |
| 2014/0085856 A1* | 3/2014 | Shirao | H01P 3/003 174/254 |

(Continued)

OTHER PUBLICATIONS

PCIe M.2 Connector PCB Layout Guideline, Amphenol ICC, Oct. 17, 2018.

*Primary Examiner* — Timothy J Thompson
*Assistant Examiner* — Amol H Patel
(74) *Attorney, Agent, or Firm* — IP & T GROUP LLP

(57) ABSTRACT

The present disclosure relates to an electronic circuit. A circuit board according to the present disclosure includes a first conductor layer including a first pad for transmitting and receiving a first signal to and from an external device, a plurality of second conductor layers stacked on the first conductor layer, and a third conductor layer stacked on the plurality of second conductor layers and including a second pad for transmitting and receiving a second signal to and from the external device, wherein at least one target conductor layer among the plurality of second conductor layers has a mesh structure and is electrically grounded, and remaining second conductor layers except for the at least one target conductor layer include respective voids and are electrically opened.

14 Claims, 8 Drawing Sheets

(56) References Cited

U.S. PATENT DOCUMENTS

| | | | |
|---|---|---|---|
| 2014/0353022 A1* | 12/2014 | Morita | H05K 1/165 |
| | | | 174/260 |
| 2019/0189164 A1 | 6/2019 | Huddar | |
| 2020/0100355 A1 | 3/2020 | Choi et al. | |
| 2021/0185809 A1* | 6/2021 | Park | H05K 1/0225 |
| 2023/0345620 A1* | 10/2023 | Liu | H05K 1/0245 |

* cited by examiner

CIRCUIT BOARD

CROSS-REFERENCE TO RELATED APPLICATION

The present application claims priority under 35 U.S.C. § 119(a) to Korean patent application number 10-2022-0065015 filed on May 26, 2022, the entire disclosure of which is incorporated by reference herein.

BACKGROUND

1. Technical Field

Various embodiments of the present disclosure relate generally to an electronic device, and more particularly, to a circuit board.

2. Related Art

Wired or wireless communication based on various forms or protocols for access from one electronic device to another electronic device or network may be used. Two electronic devices may perform wired communication through a circuit board. However, crosstalk may be caused when high-speed signals are exchanged through the circuit board, and may be reduced depending on the design architecture of the circuit board.

SUMMARY

Various embodiments of the present disclosure are directed to a circuit board having a design optimized to reduce crosstalk and achieve matching impedance in consideration of signal integrity.

According to an embodiment of the present disclosure, a circuit board may include a first conductor layer including a first pad for transmitting and receiving a first signal to and from an external device, a plurality of second conductor layers stacked on the first conductor layer, and a third conductor layer stacked on the plurality of second conductor layers and including a second pad for transmitting and receiving a second signal to and from the external device, wherein at least one target conductor layer among the plurality of second conductor layers has a mesh structure and is electrically grounded, and remaining second conductor layers except for the at least one target conductor layer include respective voids and are electrically opened.

According to an embodiment of the present disclosure, a circuit board may comprise sequentially stacked first to third conduct layers, between which dielectric layers are stacked. The first and third conduct layers have first and second pads configured to transfer first and second signals, respectively. The second conduct layers include mesh-structured ones, which are electrically grounded, and electrically open ones each having a void. The mesh-structured second conduct layers are disposed in a substantially middle between the first and second pads.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Figure 1:
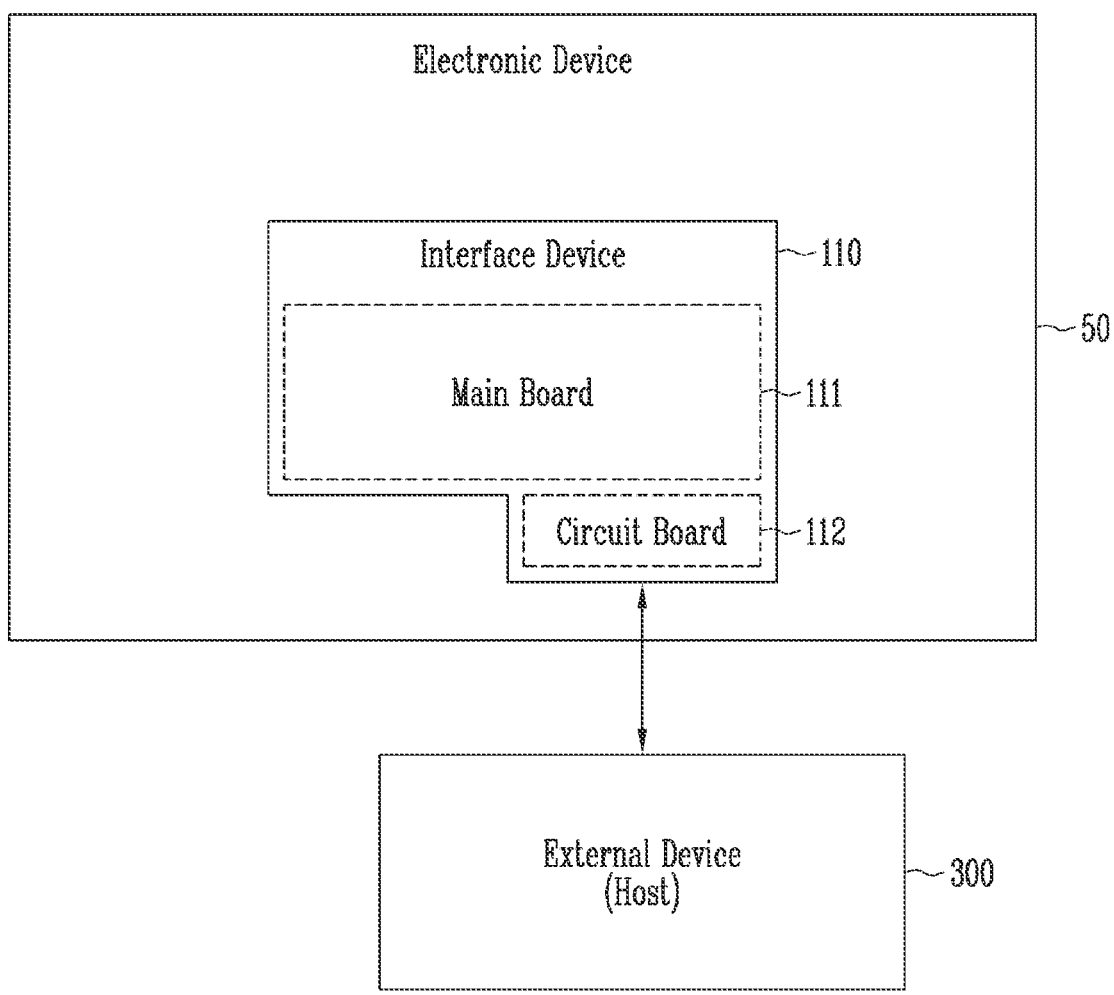
FIG. 1 is a diagram illustrating an electronic device and an external device performing communication through a circuit board according to an embodiment of the present disclosure.

FIG. 1 is a diagram illustrating an electronic device 50 and an external device 300 performing communication through a circuit board according to an embodiment of the present disclosure.

Referring to FIG. 1, the electronic device 50 may be configured to store data in response to control of the external device 300. Examples of the electronic device 50 may include a cellular phone, a smartphone, an MP3 player, a laptop computer, a desktop computer, a game player, a TV, a tablet computer, and an in-vehicle infotainment system.

The electronic device 50 may be manufactured as one of various types of electronic devices according to a communication interface with the external device 300. For example, the electronic device 50 may be configured as any of various types of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The electronic device 50 may be manufactured as any of various package types. For example, the electronic device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and/or a Wafer-level Stack Package (WSP).

The electronic device 50 may include a memory device and a memory controller that controls operations of the memory device.

According to an embodiment, examples of the memory device may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM). In the present disclosure, a description will be made below based on that the memory device is a NAND flash memory.

The memory device may receive a command and an address from the memory controller and access an area selected by the address in a memory cell array. That is, the memory device may perform an operation instructed by the command on the area selected by the address. For example, the memory device may perform a write (program) operation, a read operation, and an erase operation. During a program operation, the memory device may program data into the area selected in response to the address. During a read operation, the memory device may read data from the area selected by the address. During an erase operation, the memory device may erase stored data from the area selected by the address.

The memory controller may control the memory device to perform a program operation, a read operation, or an erase operation in response to a request from the host. During a program operation, the memory controller may provide a write command, a physical block address, and data to the memory device. During a read operation, the memory controller may provide a read command and a physical block address to the memory device. During an erase operation, the memory controller may provide an erase command and a physical block address to the memory device.

The electronic device 50 may communicate with the external device 300 through an interface device 110.

The interface device 110 device may perform communication using various communication standards or interfaces such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The interface device 110 may include a main board 111 and a circuit board 112.

The main board 111 may generate a signal to be transferred to the external device 300 through the circuit board 112, or may process a signal received from the external device 300 through the circuit board 112.

The circuit board 112 may be physically connected to the external device 300. The circuit board 112 may include a conductor which electrically transfers signals exchanged between the electronic device 50 and the external device 300. The circuit board 112 may include a printed circuit board (PCB).

Figure 2:
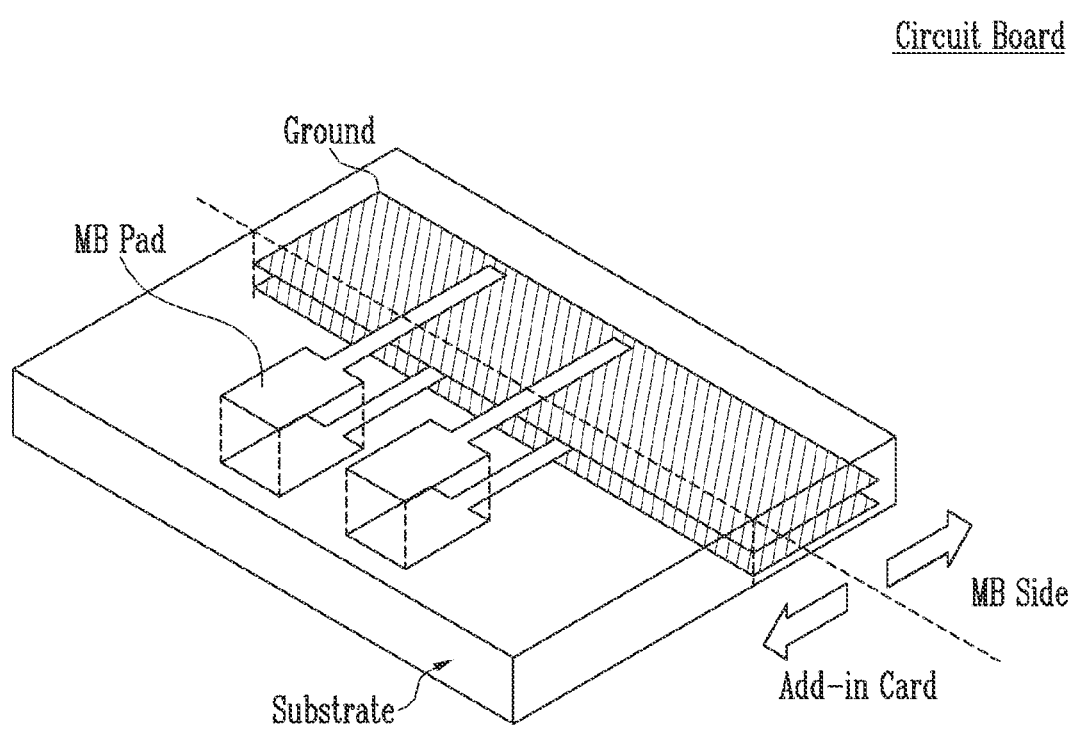
FIG. 2 is a diagram illustrating the structure of a circuit board according to an embodiment of the present disclosure.

FIG. 2 is a diagram illustrating the structure of a circuit board according to an embodiment of the present disclosure.

Referring to FIG. 2, a circuit board may include a component at a main board side and a component at a card side connected to an external device.

The component at the main board side may include a ground region.

The component at the card side may include a circuit board. The circuit board may include pads for exchanging signals between a storage device and the external device. According to an embodiment, the signals being exchanged through the pads may include signals which are defined by a Peripheral Component Interconnect Express (PCIe) protocol. The signals exchanged through the pads may be high-speed signals having a frequency greater than or equal to a predetermined value.

Figure 3:
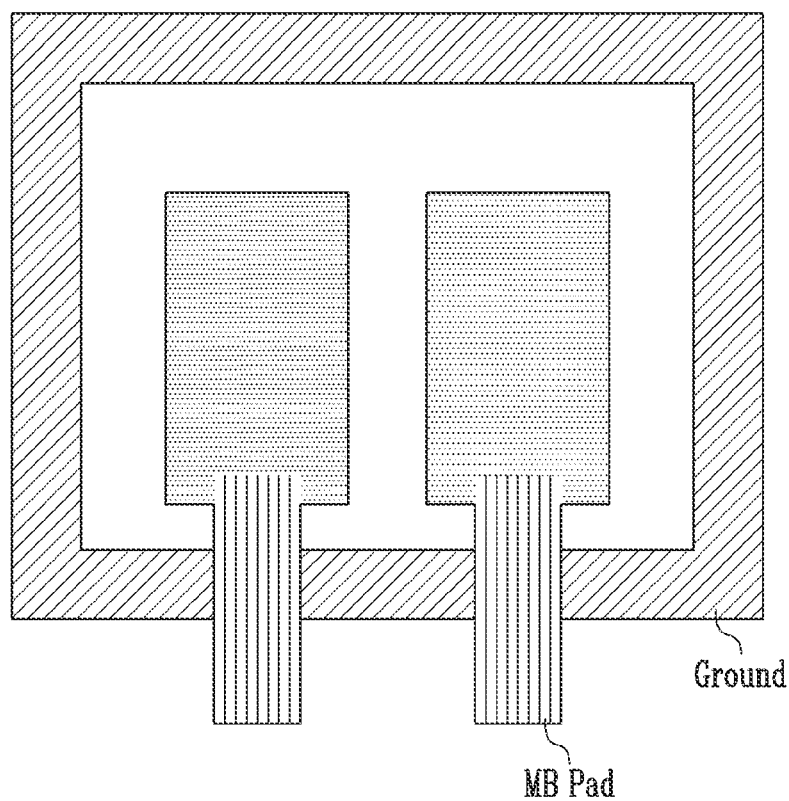
FIG. 3 is a diagram illustrating pads at a main board side in a circuit board structure according to an embodiment of the present disclosure.

FIG. 3 is a diagram illustrating pads at a main board side in a circuit board structure according to an embodiment of the present disclosure.

FIG. 3 is a top view illustrating a component at the main board side. Referring to FIG. 3, head portions of the pads may be spaced apart from the ground region at a predetermined distance. The predetermined distance may form a void. Tail portions of the pads may be located in the ground region.

Figure 4:
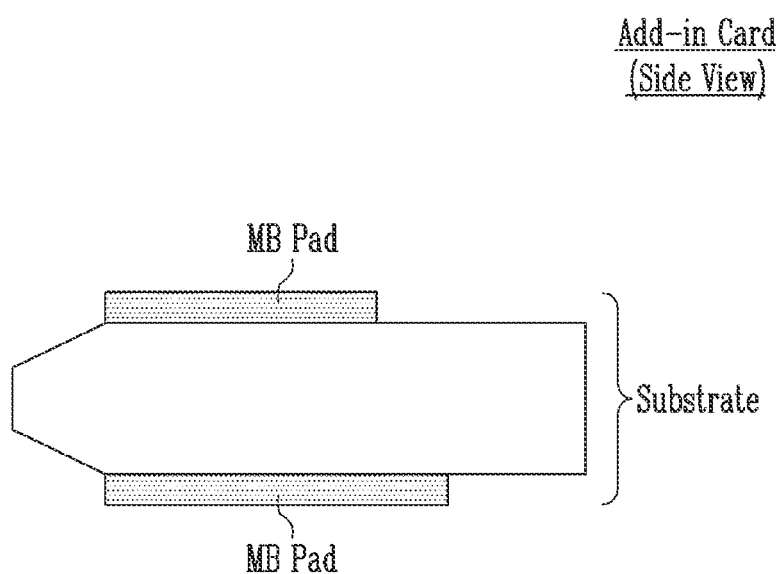
FIG. 4 is a diagram illustrating pads at a card side in a circuit board structure according to an embodiment of the present disclosure.

FIG. 4 is a diagram illustrating pads at a card side in the circuit board structure according to an embodiment of the present disclosure.

FIG. 4 is a side view illustrating the component at the card side. Referring to FIG. 4, the component at the card side may include a circuit board. Uppermost and lowermost layers of the circuit board may include pads. A length of the pad at the uppermost layer may be different from a length of the pad at the lowermost layer. In another example, the length of the pad at the uppermost layer may be the same as the length of the pad at the lowermost layer.

Conducted noise, i.e., crosstalk may be caused by parasitic capacitance and mutual inductance between the pad at the uppermost layer and the pad at the lowermost layer. Crosstalk may deteriorate quality of a signal being transferred to the pads. A circuit board structure capable of reducing crosstalk may be described with reference to FIGS. 5 and 6.

Figure 5:
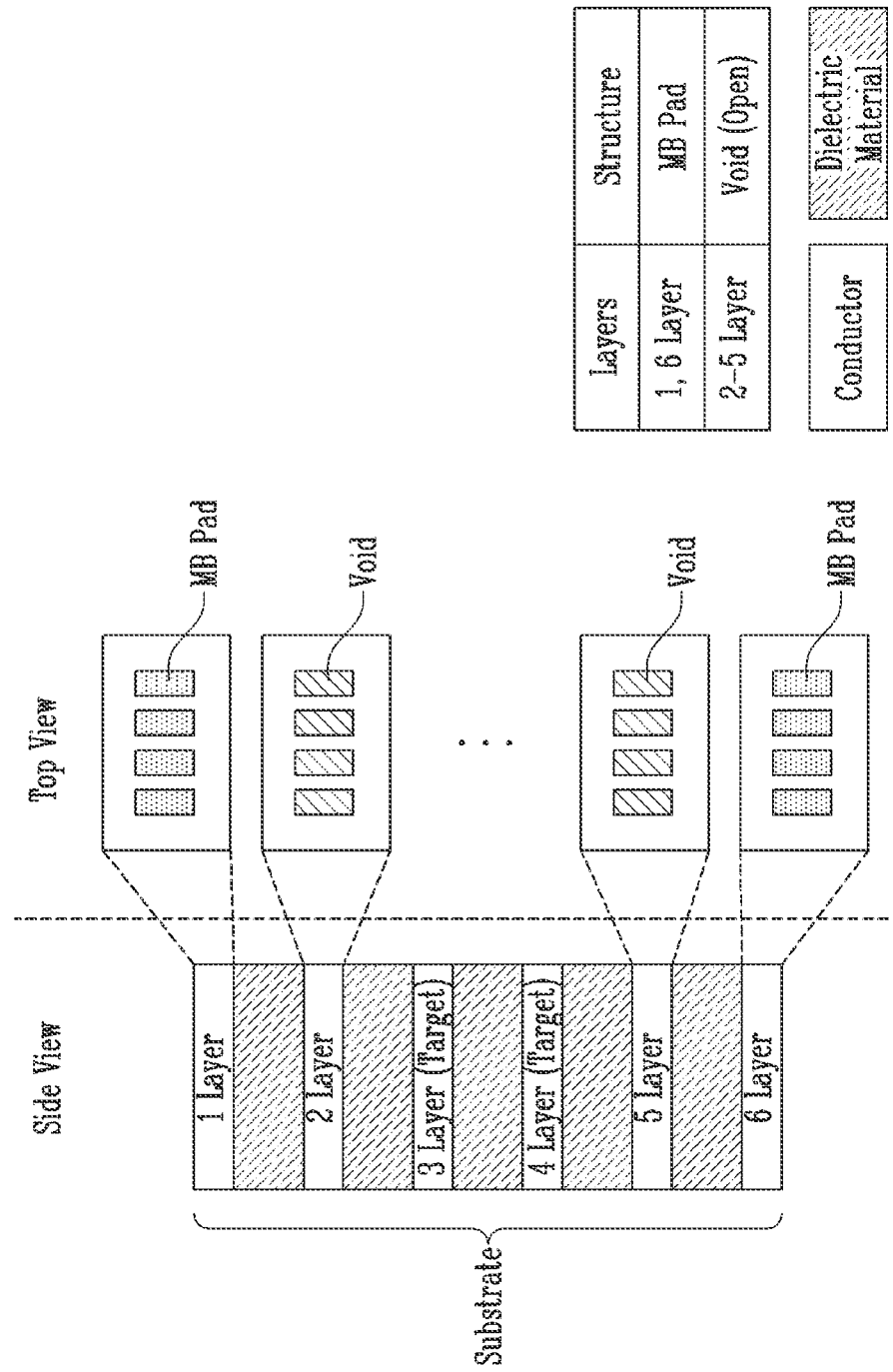
FIG. 5 is a diagram illustrating a circuit board of FIG. 4 according to an embodiment of the present disclosure.

FIG. 5 is a diagram illustrating a circuit board of FIG. 4 according to an embodiment of the present disclosure.

Referring to FIG. 5, a circuit board may include first to sixth conductor layers. The number of conductor layers included in the circuit board is not limited to this embodiment.

Dielectric layers may be located between the first to sixth conductor layers. The dielectric layers may include a glass epoxy laminate material. More specifically, the dielectric layers may be manufactured using FR-4.

The first conductor layer may include a first pad for transmission of a first signal. The sixth conductor layer may include a second pad for transmission of a second signal. According to an embodiment, each of the first and second signals may be a high-speed signal having a frequency greater than or equal to a predetermined value. According to another embodiment, one of the first and second signals may be a high-speed signal having a frequency greater than or equal to the predetermined value, and the other may be a low-speed signal having a frequency less than the predetermined value.

Each of the first and second pads may include a material having an electrical conductivity greater than or equal to a reference value for electrical signal transmission. For example, the first and second pads may include gold or copper.

The size of the first and second pads may be increased for connection between the circuit board and the external device. As a result, impedance between the first and second pads may be reduced. Therefore, for impedance matching with a target value in consideration of impedance of the external device, the second to fifth conductor layers may include a void and be electrically opened. The impedance between the first and second pads may be differential impedance.

Since the electrically opened conductor layers are arranged between the first pad and the second pad, the crosstalk between the first and second pads may be increased.

Figure 6:
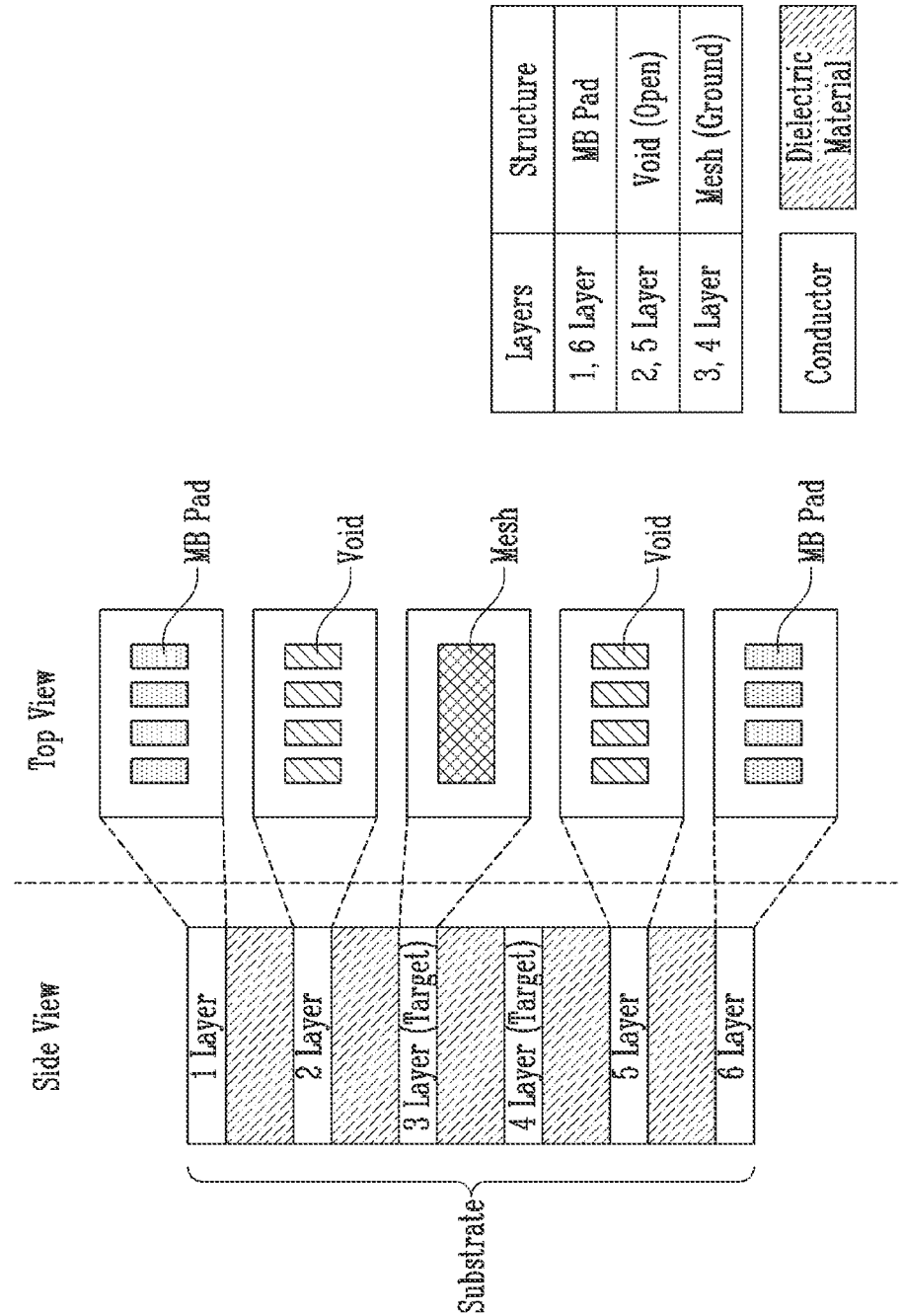
FIG. 6 is a diagram illustrating a circuit board of FIG. 4 according to an embodiment of the present disclosure.

FIG. 6 is a diagram illustrating the circuit board of FIG. 4 according to an embodiment of the present disclosure.

Referring to FIG. 6, the circuit board may include the first to sixth conductor layers. The number of conductor layers included in the circuit board is not limited to this embodiment. The first, second, fifth, and sixth conductor layers are the same as described above with reference to FIG. 5.

At least one of the second to fifth conductor layers located between the first conductor layer and the sixth conductor layer may be set as a target conductor layer. The target conductor layer may have a mesh structure and be electrically grounded.

Since the target conductor layer is located between the first conductor layer and the sixth conductor layer, impedance between the first and second pads may be controlled and crosstalk may be reduced.

According to an embodiment, the position of the target conductor layer may be set based on at least one of reduction of crosstalk between the first and second pads and impedance matching between the first and second pads. For example, the target conductor layer may be disposed at a position at which a crosstalk value may be reduced. Thus, the target conductor layer may be located in the middle of the first conductor layer and the sixth conductor layer. As shown in FIG. 6, the third and fourth conductor layers which are located in the middle of the first conductor layer and the sixth conductor layer may be set as target conductor layers.

According to an embodiment, the number of target conductor layers may be set so as to achieve at least one of reduction of crosstalk between the first and second pads and impedance matching between the first and second pads. For example, the number of target conductor layers may be set to a value by which a crosstalk value is reduced.

For example, since the number of conductor layers located between the first conductor layer and the sixth conductor layer is an even number, the number of target conductor layers may also be set to an even number due to the symmetrical structure thereof. In FIG. 6, there may be two target conductor layers.

However, the position and number of target conductor layers are not limited to this embodiment. According to an embodiment, when the number of conductor layers included in the circuit board is an odd number, the number of target conductor layers may be set to an odd number. According to an embodiment, when a high-speed signal is transferred from the uppermost conductor layer and a low-speed signal is transferred from the lowermost conductor layer, the target conductor layer may be located closer to the lowermost conductor layer than to the uppermost conductor layer so as to reduce crosstalk and achieve impedance matching.

According to an embodiment, the number of conductor layers, the number of target conductor layers included in the circuit board, and the position of the target conductor layers may vary depending on environment where the circuit board is used. For example, circuit boards may be used for enterprises, workstations, or mobile applications.

In the embodiment as described above with reference to FIG. 6, electrically opened conductor layers may be arranged between the first pad and the second pad. By inserting an electrically grounded conductor layer between the electrically opened conductor layers, crosstalk may be reduced. According to an embodiment, the circuit board may be designed in such a way that a pattern of a pad end portion may be the same as a width of a connector end for connection with the external device. This may result in impedance discontinuity portions. Thus, the circuit board may be designed such that a plurality of conductor layers under the pad end may be opened for impedance matching and intermediate layers of the circuit board may have a mesh pattern for reducing crosstalk.

Figure 7:
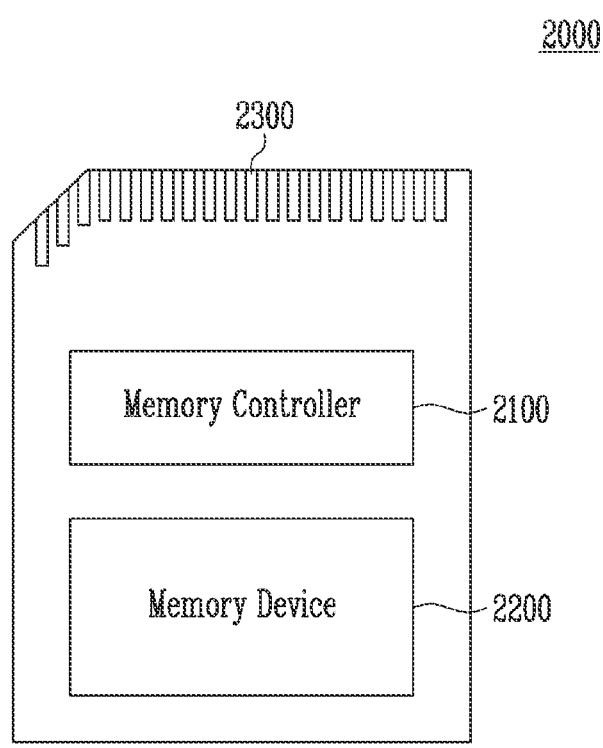
FIG. 7 is a block diagram illustrating a memory card system to which a circuit board is applied according to an embodiment of the present disclosure.

FIG. 7 is a diagram illustrating a memory card system 2000 according to an embodiment of the present disclosure.

Referring to FIG. 7, the memory card system 2000 may include a memory controller 2100, a memory device 2200 and a circuit board 2300.

The memory controller 2100 may be electrically coupled to the memory device 2200. The memory controller 2100 may be configured to access the memory device 2200. For example, the memory controller 2100 may control read, write, erase, and background operations of the memory device 2200. The memory controller 2100 may be configured to provide an interface between the memory device 2200 and a host. In addition, the memory controller 2100 may be configured to drive firmware for controlling the memory device 2200.

For example, the memory controller 2100 may include components, such as a Random Access Memory (RAM), a processing unit, a host interface, a memory interface, and an ECC block.

The memory controller 2100 may communicate with an external device through the circuit board 2300. The memory controller 2100 may communicate with an external device (e.g., host) based on a specific communication protocol. For example, the memory controller 2100 may communicate with the external device through at least one of various communication standards or interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. For example, the circuit board 2300 may be defined by at least one of the above-described various communication standards or interfaces.

In an embodiment, the memory device 2200 may be embodied as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), a universal flash storage (UFS), and the like.

Figure 8:
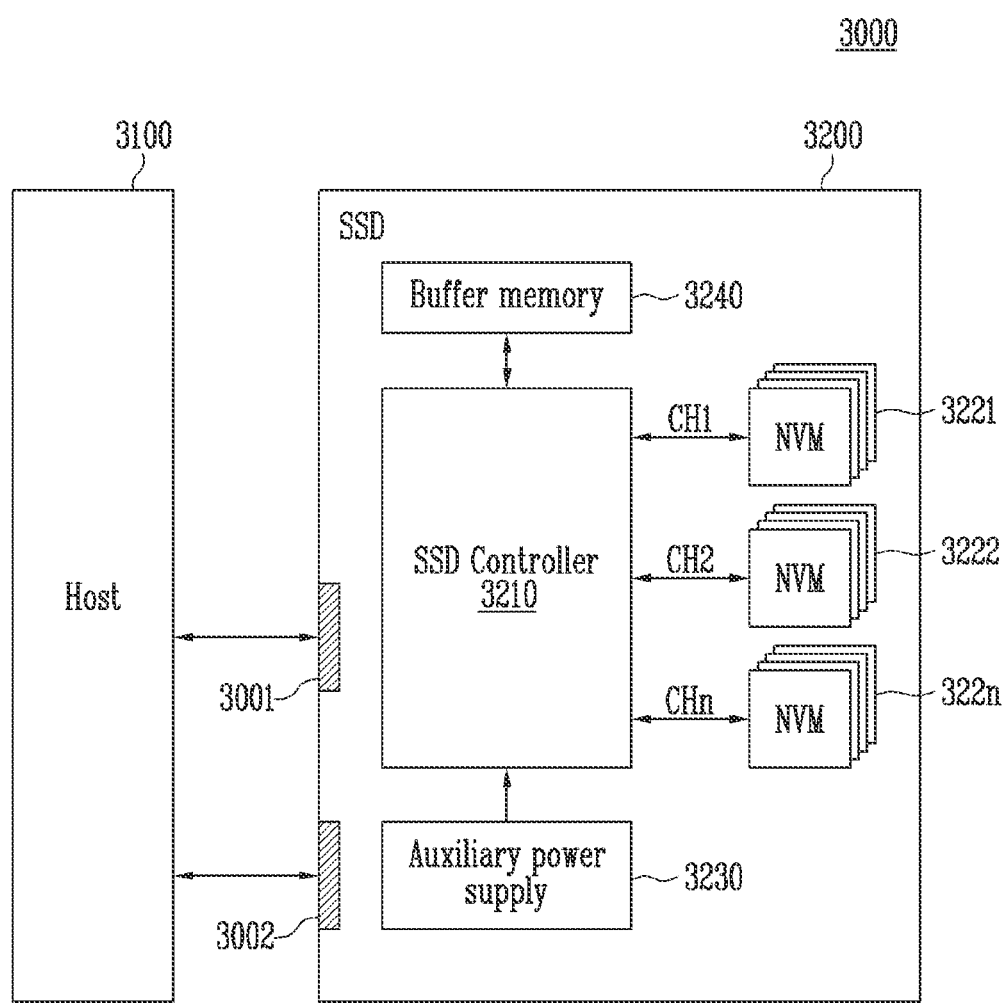
FIG. 8 is a block diagram illustrating a solid state drive (SSD) system to which a circuit board according to an embodiment of the present disclosure is applied.

FIG. 8 is a diagram illustrating a solid state drive (SSD) system 3000 according to an embodiment of the present disclosure.

Referring to FIG. 8, the SSD system 3000 may include a host 3100 and an SSD 3200. The SSD 3200 may exchange signals SIG with the host 3100 through a signal circuit board 3001 and may receive power PWR through a power circuit board 3002. The circuit board 112 as described above with reference to FIG. 1 may be included in the signal circuit board 3001.

The SSD 3200 may include an SSD controller 3210, a plurality of flash memories 3221 to 322n, an auxiliary power supply 3230, and a buffer memory 3240.

The SSD controller 3210 may control the plurality of flash memories 3221 to 322n in response to the signals SIG received from the host 3100. For example, the signals SIG may be based on the interfaces of the host 3100 and the SSD 3200. For example, the signals SIG may be defined by at least one of various communication standards or interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power circuit board 3002. The auxiliary power supply 3230 may be supplied and charged with the power PWR from the host 3100. The auxiliary power supply 3230 may supply the power to the SSD 3200 when power is not smoothly supplied from the host 3100. According to an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Various embodiments of the present disclosure provide a circuit board having a design optimized to reduce crosstalk and achieve matching impedance in consideration of signal integrity.

What is claimed is:

1. A circuit board comprising:
    a first conductor layer including a first pad for transmitting and receiving a first signal to and from an external device;
    a plurality of second conductor layers stacked on the first conductor layer; and
    a third conductor layer stacked on the plurality of second conductor layers, and including a second pad for transmitting and receiving a second signal to and from the external device,
    wherein at least one target conductor layer among the plurality of second conductor layers has a mesh structure and is electrically grounded, and
    wherein remaining second conductor layers except for the at least one target conductor layer include respective voids and are electrically opened.

2. The circuit board of claim 1, wherein the at least one target conductor layer is disposed at a position at which a crosstalk value between the first pad and the second pad is reduced.

3. The circuit board of claim 1, wherein a number of the at least one target conductor layer is set to a value by which a crosstalk value between the first pad and the second pad is reduced.

4. The circuit board of claim 1, wherein the at least one target conductor layer is disposed at a position at which impedance is matched between the first pad and the second pad.

5. The circuit board of claim 1, wherein a number of the at least one target conductor layer is set to a value by which impedance is matched between the first pad and the second pad.

6. The circuit board of claim 1, wherein the at least one target conductor layer is located in a middle of the first pad and the second pad.

7. The circuit board of claim 1, wherein a number of the at least one target conductor layer is an even number.

8. The circuit board of claim 1, further comprising dielectric layers stacked on the first conductor layer, between the plurality of second conductor layers and underneath the third conductor layers.

9. The circuit board of claim 8, wherein the dielectric layers include a glass epoxy laminate material.

10. The circuit board of claim 1, wherein each of the first pad and the second pad includes a material having an electrical conductivity greater than or equal to a reference value.

11. The circuit board of claim 1, wherein the first signal and the second signal include a signal defined by a Peripheral Component Interconnect Express (PCIe) protocol.

12. The circuit board of claim 1, wherein the first signal and the second signal are high-speed signals having a frequency greater than or equal to a predetermined value.

13. The circuit board of claim 1, wherein one of the first signal and the second signal is a high-speed signal having a frequency greater than or equal to a predetermined value, and the other signal is a low-speed signal having a frequency less than the predetermined value.

14. A circuit board comprising:
    sequentially stacked first to third conduct layers, between which dielectric layers are stacked, wherein:
    the first and third conduct layers have first and second pads configured to transfer first and second signals, respectively,
    the second conduct layers include mesh-structured ones, which are electrically grounded, and electrically open ones each having a void, and
    the mesh-structured second conduct layers are disposed in a middle between the first and second pads.

* * * * *